(12) United States Patent
Shimizu et al.

(10) Patent No.: US 9,756,763 B2
(45) Date of Patent: Sep. 5, 2017

(54) COOLING FLUID SUPPLY APPARATUS WITH SAFETY MECHANISM AND METHOD FOR COOLING HEAT LOAD

(71) Applicant: SMC CORPORATION, Chiyoda-ku (JP)

(72) Inventors: Fumiaki Shimizu, Moriya (JP); Hideo Morita, Kashiwa (JP); Katsutoshi Sato, Moriya (JP)

(73) Assignee: SMC CORPORATION, Chiyoda-ku (JP)

( * ) Notice: Subject to any disclaimer, the term of this patent is extended or adjusted under 35 U.S.C. 154(b) by 61 days.

(21) Appl. No.: 15/012,225

(22) Filed: Feb. 1, 2016

(65) Prior Publication Data

US 2016/0234969 A1 Aug. 11, 2016

(30) Foreign Application Priority Data

Feb. 6, 2015 (JP) ................................. 2015-022201

(51) Int. Cl.
*F28F 3/00* (2006.01)
*H05K 7/20* (2006.01)

(52) U.S. Cl.
CPC ................................. *H05K 7/20281* (2013.01)

(58) Field of Classification Search
CPC ...... H05K 7/20281; F28F 27/00; F28F 27/02; F28D 1/04; F28D 15/02; F24H 3/06; F24H 3/062; F24H 3/12
USPC ....................................................... 165/11.1
See application file for complete search history.

(56) References Cited

U.S. PATENT DOCUMENTS

| 8,869,552 | B2* | 10/2014 | Dresens | B01D 8/00 |
| | | | | 165/11.1 |
| 2009/0000779 | A1* | 1/2009 | Hickam | F01P 7/167 |
| | | | | 165/299 |
| 2013/0139996 | A1* | 6/2013 | Hashimoto | F28F 27/00 |
| | | | | 165/11.1 |
| 2014/0142819 | A1* | 5/2014 | Pursifull | F01P 11/16 |
| | | | | 701/51 |
| 2014/0338857 | A1* | 11/2014 | Ruby | F01P 3/20 |
| | | | | 165/11.1 |

FOREIGN PATENT DOCUMENTS

JP 2009-25150 2/2009

* cited by examiner

*Primary Examiner* — Davis Hwu
(74) *Attorney, Agent, or Firm* — Oblon, McClelland, Maier & Neustadt, L.L.P.

(57) ABSTRACT

To provide a cooling fluid supply apparatus capable of continuing cooling a heat load even when supply of a cooling fluid stops while the heat load is running. A cooling fluid circulation path connecting a cooling fluid supply apparatus and a heat load and a heat-dissipating fluid circulation path connecting the cooling fluid supply apparatus and a heat-dissipating fluid supply apparatus are connected with bypass pipes and disposed therebetween. When a cooling fluid is supplied from the cooling fluid supply apparatus to the heat load, the cooling fluid circulation path and heat-dissipating fluid circulation path are disconnected by closing the bypass pipes and by using the overheating prevention valves. When the supply of the cooling fluid from the cooling fluid supply apparatus to the heat load is stopped, a heat-dissipating fluid from the heat-dissipating fluid supply apparatus is supplied to the heat load by connecting the cooling fluid circulation path and heat-dissipating fluid circulation path by using the overheating prevention valves.

8 Claims, 4 Drawing Sheets

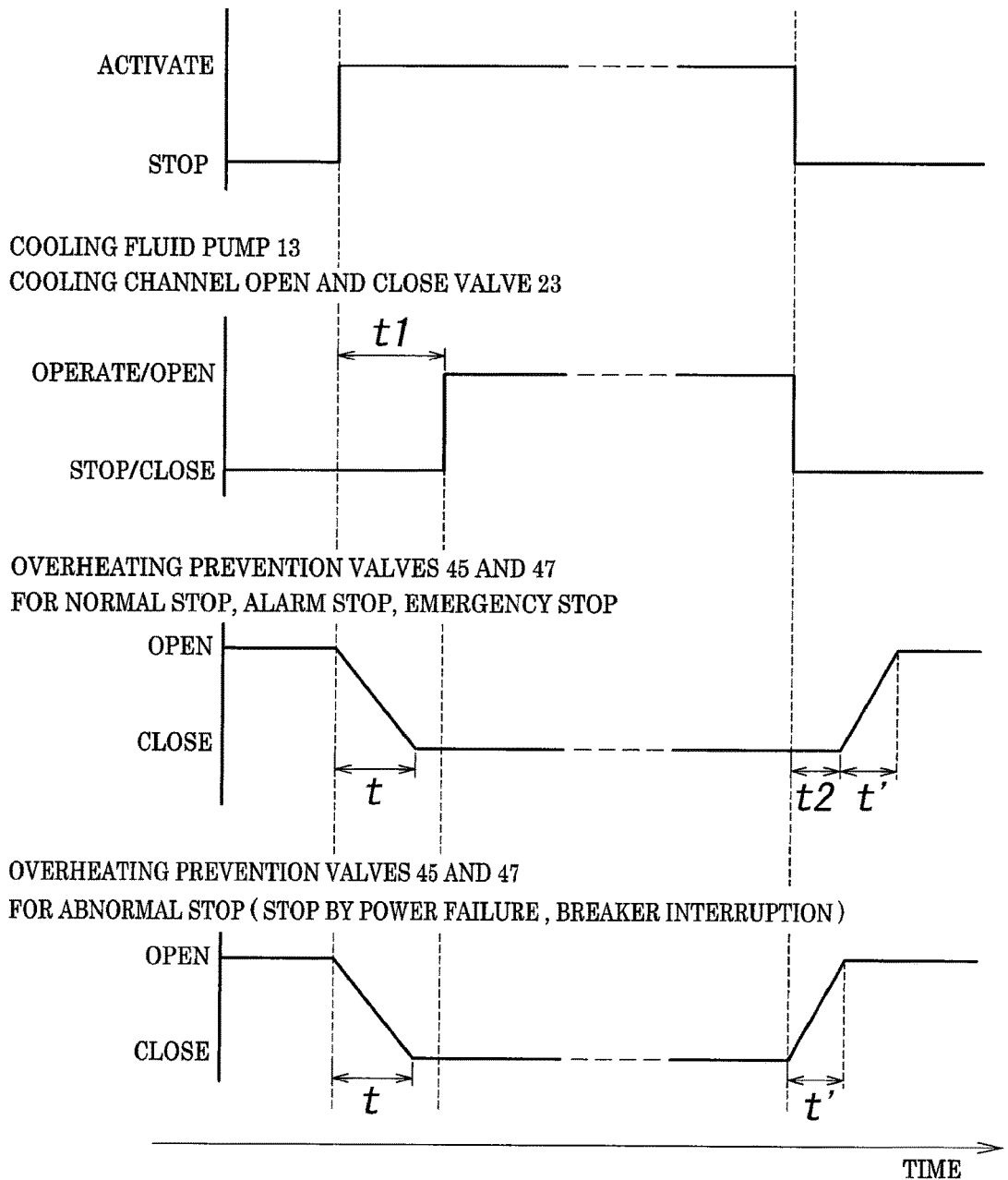

COOLING FLUID SUPPLY APPARATUS WITH SAFETY MECHANISM AND METHOD FOR COOLING HEAT LOAD

TECHNICAL FIELD

The present invention relates to a cooling fluid supply apparatus for supplying a cooling fluid to an apparatus that generates heat (heat load), such as semiconductor equipment and, more specifically, to a cooling fluid supply apparatus that includes a safety mechanism and that is capable of preventing overheating of a heat load by continuing cooling of the heat load even when operation of the cooling fluid supply apparatus is stopped by some malfunction and the cooling fluid is not supplied to the heat load. The present invention also relates to a method for cooling a heat load.

BACKGROUND ART

Example manufacturing apparatuses of various types, such as semiconductor equipment and liquid crystal manufacturing apparatuses, are heated by heaters or the like while running, and they are cooled by cooling fluids supplied from cooling fluid supply apparatuses to maintain them at constant temperatures. One such cooling fluid supply apparatus is recommended to include a safety device to enable preventing overheating of the heat load by continuing cooling the heat load even when the operation of the cooling fluid supply apparatus is stopped by some malfunction occurring while the manufacturing apparatus (heat load) is running and the supply of the cooling fluid to the heat load is stopped.

Patent Literature 1 discloses a water-cooling IC testing device. The IC testing device is configured such that when a malfunction occurs in a water-cooling system on a test head side, the water-cooling system on the test head side can be safely stopped, independently of an apparatus for supplying a cooling fluid.

This IC testing device can ensure safety by stopping the water-cooling system on the test head side in the case where a malfunction occurs in the water-cooling system on the test head side. However, there is a problem in that in the case where a malfunction occurs in the cooling fluid supply apparatus and the supply of the cooling fluid is stopped, the test head is not cooled and thus tends to significantly overheat.

CITATION LIST

Patent Literature

PTL 1: Japanese Unexamined Patent Application Publication No. 2009-25150

SUMMARY OF INVENTION

Technical Problem

A technical object of the present invention is to provide a fairly safe cooling fluid supply apparatus capable of preventing overheating of a heat load by continuing cooling it even when operation of a cooling fluid supply apparatus is stopped by some malfunction while the heat load is running and the supply of the cooling fluid to the heat load is stopped.

Solution to Problem

To achieve the above object, a cooling fluid supply apparatus with a safety mechanism according to the present invention includes a temperature adjusting portion configured to cause a cooling fluid and a heat-dissipating fluid to exchange heat with each other and adjust a temperature of the cooling fluid and a user-pipe connecting portion for connecting the temperature adjusting portion to a heat load and a heat-dissipating fluid supply apparatus with user pipes disposed therebetween.

The user-pipe connecting portion includes a cooling fluid outflow pipe allowing the cooling fluid to flow from the temperature adjusting portion toward the heat load therethrough, a cooling fluid inflow pipe allowing the cooling fluid to flow from the heat load toward the temperature adjusting portion therethrough, a heat-dissipating fluid inflow pipe allowing the heat-dissipating fluid to flow from the heat-dissipating fluid supply apparatus toward the temperature adjusting portion therethrough, and a heat-dissipating fluid outflow pipe allowing the heat-dissipating fluid to flow from the temperature adjusting portion toward the heat-dissipating fluid supply apparatus therethrough. The user-pipe connecting portion further includes a first bypass pipe connecting the cooling fluid outflow pipe and the heat-dissipating fluid inflow pipe and a second bypass pipe connecting the cooling fluid inflow pipe and the heat-dissipating fluid outflow pipe. The first bypass pipe is connected to a first overheating prevention valve configured to open and close the first bypass pipe and to a first check valve configured to block a stream of the fluid from the cooling fluid outflow pipe toward the heat-dissipating fluid inflow pipe. The second bypass pipe is connected to a second overheating prevention valve configured to open and close the second bypass pipe and to a second check valve configured to block a stream of the fluid from the heat-dissipating fluid outflow pipe toward the cooling fluid inflow pipe.

In the present invention, the first overheating prevention valve and the second overheating prevention valve may be operated such that they close the first bypass pipe and the second bypass pipe, respectively, when the temperature adjusting portion is in operation and such that they open the first bypass pipe and the second bypass pipe, respectively, when the temperature adjusting portion is not in operation.

In the present invention, preferably, the cooling fluid outflow pipe may be connected to a third check valve configured to prevent backflow of the fluid flowing toward the temperature adjusting portion in a location near the temperature adjusting portion with respect to a location where the first bypass pipe is connected.

It is recommended that a filter for filtering the heat-dissipating fluid be connected to the first bypass pipe between the heat-dissipating fluid inflow pipe and the first overheating prevention valve.

According to a specific configuration of the present invention, the temperature adjusting portion may include a heat exchanger configured to cause the cooling fluid and the heat-dissipating fluid to exchange heat with each other, a cooling fluid pump configured to send the cooling fluid having an adjusted temperature to the heat load through the cooling fluid outflow pipe, and a cooling channel open and close valve configured to open and close a channel for the cooling fluid. The cooling channel open and close valve may open the channel for the cooling fluid when the temperature adjusting portion is in operation and may close the channel for the cooling fluid when the temperature adjusting portion is not in operation.

The temperature adjusting portion may include a housing, the heat exchanger, the cooling fluid pump, and the cooling channel open and close valve are disposed inside the housing, and the user-pipe connecting portion is arranged outside the housing.

According to the present invention, provided is a cooling method for cooling a heat load by supplying a cooling fluid to the heat load by using a cooling fluid pump in a cooling fluid supply apparatus, the cooling fluid having a temperature adjusted by causing the cooling fluid circulating in a cooling fluid circulation path connecting the cooling fluid supply apparatus and the heat load and a heat-dissipating fluid circulating in a heat-dissipating fluid circulation path connecting the cooling fluid supply apparatus and a heat-dissipating fluid supply apparatus to exchange heat with each other.

In the cooling method, the cooling fluid circulation path and the heat-dissipating fluid circulation path are connected with bypass pipes openable and closable by overheating prevention valves disposed therebetween. When the cooling fluid is supplied to the heat load by operation of the cooling fluid supply apparatus, the cooling fluid circulation path and the heat-dissipating fluid circulation path are disconnected from each other by closing the bypass pipes by using the overheating prevention valves. When the supply of the cooling fluid to the heat load is stopped by a stop of the operation of the cooling fluid supply apparatus, the heat-dissipating fluid from the heat-dissipating fluid supply apparatus is supplied to the heat load by connecting the cooling fluid circulation path and the heat-dissipating fluid circulation path to each other by opening the bypass pipes by using the overheating prevention valves.

In the cooling method, preferably, when the cooling fluid supply apparatus is activated, the cooling fluid pump may be operated after a delay time after an action of closing the overheating prevention valves starts, and when operation of the cooling fluid supply apparatus is stopped in an energized state, the overheating prevention valves may be opened after a delay time after the cooling fluid pump is stopped.

Advantageous Effects of Invention

According to the present invention, even when the operation of the cooling fluid supply apparatus is stopped by some malfunction and the supply of the cooling fluid to the heat load is stopped, the heat load can be cooled by the supply of the heat-dissipating fluid to the heat load, and thus the overheating of the heat load can be prevented.

BRIEF DESCRIPTION OF DRAWINGS

FIG. 4 is a time chart for the second cooling method.

DESCRIPTION OF EMBODIMENTS

Figure 1:
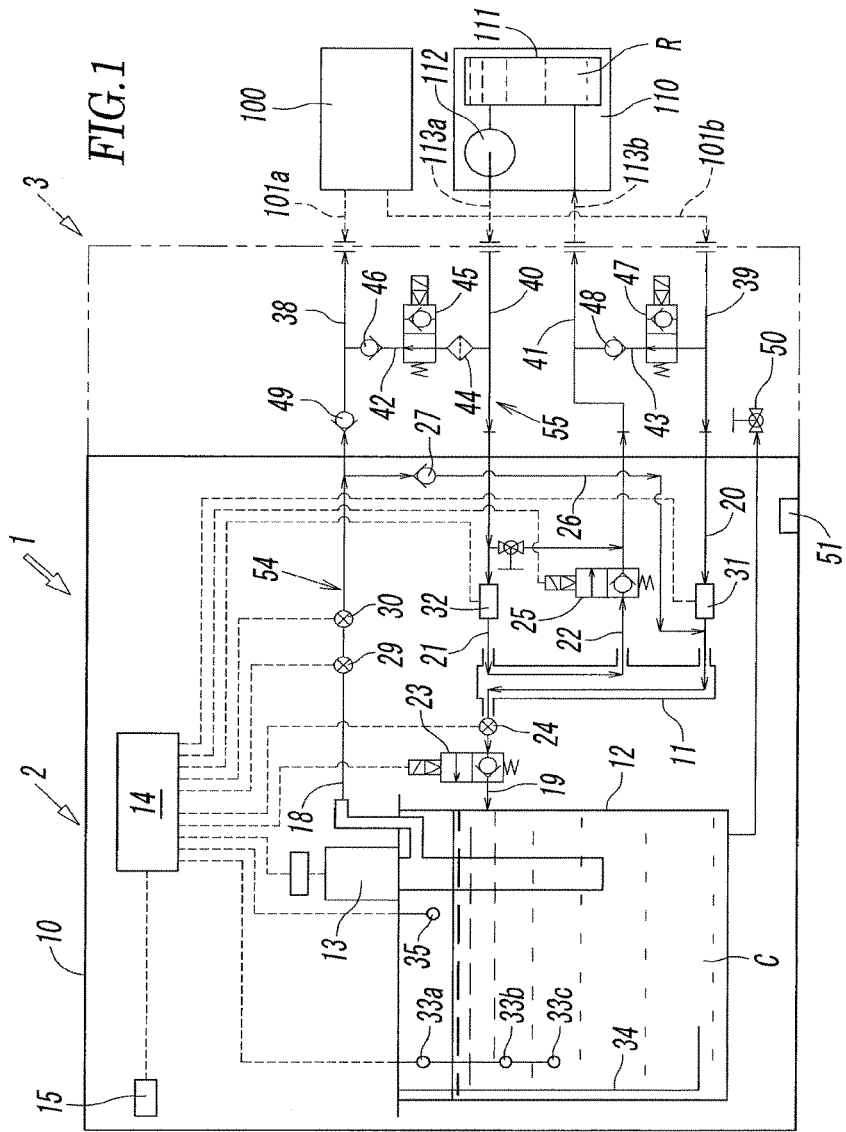
FIG. 1 is a circuit diagram that illustrates an embodiment of a cooling fluid supply apparatus with a safety mechanism according to the present invention by using symbols.

FIG. 1 illustrates one embodiment of a cooling fluid supply apparatus with a safety mechanism according to the present invention by using symbols. A cooling fluid supply apparatus 1 includes a temperature adjusting portion 2 configured to cause a cooling fluid C and a heat-dissipating fluid R to exchange heat with each other and adjust the cooling fluid and a user-pipe connecting portion 3 for connecting the temperature adjusting portion 2, a heat load 100, and a heat-dissipating fluid supply apparatus 110 with user pipes 101a, 101b, 113a, and 113b disposed therebetween.

The heat load 100 is a load that generates heat by being heated by a heater or the like while running, for example, semiconductor equipment or a liquid crystal manufacturing apparatus, and is maintained at a constant temperature by being cooled by the cooling fluid C supplied from the cooling fluid supply apparatus 1.

The heat-dissipating fluid R receives heat from the cooling fluid with a temperature raised by cooling the heat load 100 and dissipates it. The heat-dissipating fluid receiving the heat is cooled by dissipating the heat at a heat dissipating portion 111 in the heat-dissipating fluid supply apparatus 110, which is in a location different from that of the cooling fluid supply apparatus 1, and is then supplied to the temperature adjusting portion 2 by a heat-dissipating pump 112.

Examples of the cooling fluid and heat-dissipating fluid may include industrial water (water for facilities), pure water, and city water. In this case, normally, water containing less impurities than those in the heat-dissipating fluid is used as the cooling fluid. Both may be the same. Either one may be antifreeze. In short, both are fluids that do not cause a chemical change when they are mixed. In the illustrated embodiment, industrial water is used as the heat-dissipating fluid, and water cleaner than the heat-dissipating fluid is used as the cooling fluid.

The temperature adjusting portion 2 includes a housing 10 and, inside the housing 10, a heat exchanger 11 configured to cause the cooling fluid and heat-dissipating fluid to exchange heat with each other, a cooling fluid tank 12 configured to store the cooling fluid having a temperature adjusted by the heat exchange with the heat-dissipating fluid, a cooling fluid pump 13 configured to send the cooling fluid in the cooling fluid tank 12 toward the heat load 100, and a controller 14 configured to exercise control over the cooling fluid supply apparatus 1 under an installed program. An operating and display panel 15 having an operating switch, indicator, and the like is disposed on the surface of the housing 10.

Inside the housing 10, a cooling fluid discharge pipe 18 is connected to a discharge port of the cooling fluid pump 13, a cooling fluid recovery pipe 19 is connected between a cooling fluid outlet of the heat exchanger 11 and the cooling fluid tank 12, a cooling fluid return pipe 20 is connected to a cooling fluid inlet of the heat exchanger 11, a heat-dissipating fluid inlet pipe 21 is connected to a heat-dissipating fluid inlet of the heat exchanger 11, and a heat-dissipating fluid outlet pipe 22 is connected to a heat-dissipating fluid outlet of the heat exchanger 11.

The cooling fluid recovery pipe 19 is connected to a cooling channel open and close valve 23 configured to open and close a return-side channel for the cooling fluid and to a first temperature sensor 24 configured to detect a temperature of the cooling fluid after its temperature is adjusted in the heat exchanger 11. The heat-dissipating fluid outlet pipe 22 is connected to a heat-dissipating channel open and close valve 25 whose opening and closing are controlled by the controller 14 in accordance with the temperature of the cooling fluid detected by the first temperature sensor 24.

Each of the cooling channel open and close valve 23 and heat-dissipating channel open and close valve 25 is composed of a normally closed two-port solenoid valve and is electrically connected to the controller 14. When the cooling fluid supply apparatus 1 is not in operation, as illustrated in the drawing, the cooling channel open and close valve 23 and heat-dissipating channel open and close valve 25 are in a closed valve state because of non-energization and close the cooling fluid recovery pipe 19 and heat-dissipating fluid outlet pipe 22, respectively. When the cooling fluid supply apparatus 1 is in operation, they are switched to an opened valve state because of energization and open the cooling fluid recovery pipe 19 and heat-dissipating fluid outlet pipe 22, respectively.

In the illustrated example, each of the cooling channel open and close valve 23 and heat-dissipating channel open and close valve 25 is composed of a pilot two-port solenoid valve of the single-acting solenoid spring return type having the checking function. Each of them may also be composed of a two-port valve having no checking function.

The cooling fluid discharge pipe 18 and cooling fluid return pipe 20 are connected to one end and another end of a branch pipe 26, respectively. The branch pipe 26 is connected to a branch-pipe check valve 27 configured to prevent backflow of a cooling fluid flowing from the cooling fluid return pipe 20 toward the cooling fluid discharge pipe 18. The branch pipe 26 functions to ensure safety of the cooling fluid supply apparatus 1 by diverting part of the cooling fluid sent from the cooling fluid discharge pipe 18 toward the heat load 100 into the cooling fluid return pipe 20.

The cooling fluid discharge pipe 18 is connected to a second temperature sensor 29 configured to detect a temperature of the cooling fluid sent toward the heat load 100 and to a pressure sensor 30 configured to detect a pressure of that cooling fluid. The cooling fluid return pipe 20 is connected to a cooling fluid flow rate sensor 31 configured to detect a flow rate of the cooling fluid returned from the heat load 100. The heat-dissipating fluid inlet pipe 21 is connected to a heat-dissipating fluid flow rate sensor 32 configured to detect a flow rate of the heat-dissipating fluid.

The second temperature sensor 29, pressure sensor 30, cooling fluid flow rate sensor 31, and heat-dissipating fluid flow rate sensor 32 are electrically connected to the controller 14. The controller 14 controls the cooling fluid supply apparatus 1, displays running statuses, issues alerts, and the like on the detection signals.

Inside the cooling fluid tank 12, first to third fluid level sensors 33a, 33b, and 33c configured to detect fluid levels of the cooling fluid C, a heater 34 for heating the cooling fluid C, and a temperature fuse 35 configured to start working and stop the apparatus when the temperature of the cooling fluid C rises too high are disposed, and they are electrically connected to the controller 14.

The first fluid level sensor 33a detects that the fluid level reaches an upper limit. The second fluid level sensor 33b detects that the fluid level is near a lower limit. The third fluid level sensor 33c detects that the fluid level reaches the lower limit. They issue alert signals on the detection.

The heater 34 functions to heat the cooling fluid to a temperature suited for cooling the heat load 100 when the temperature of the cooling fluid is too low, for example, when the cooling fluid supply apparatus 1 is activated.

The user-pipe connecting portion 3 is arranged outside the housing 10 in the temperature adjusting portion 2 and includes a cooling fluid outflow pipe 38 connected to the cooling fluid discharge pipe 18, a cooling fluid inflow pipe 39 connected to the cooling fluid return pipe 20, a heat-dissipating fluid inflow pipe 40 connected to the heat-dissipating fluid inlet pipe 21, and a heat-dissipating fluid outflow pipe 41 connected to the heat-dissipating fluid outlet pipe 22.

The cooling fluid outflow pipe 38 and heat-dissipating fluid inflow pipe 40 are connected at their midpoints by a first bypass pipe 42. The cooling fluid inflow pipe 39 and heat-dissipating fluid outflow pipe 41 are connected at their midpoints by a second bypass pipe 43. The first bypass pipe 42 is connected to a filter 44 for filtering the heat-dissipating fluid, a first overheating prevention valve 45 configured to open and close the first bypass pipe 42, and a first check valve 46 configured to block a stream of the fluid from the cooling fluid outflow pipe 38 toward the heat-dissipating fluid inflow pipe 40 in this order in a direction from the heat-dissipating fluid inflow pipe 40 toward the cooling fluid outflow pipe 38. The second bypass pipe 43 is connected to a second overheating prevention valve 47 configured to open and close the second bypass pipe 43 and a second check valve 48 configured to block a stream of the fluid from the heat-dissipating fluid outflow pipe 41 toward the cooling fluid inflow pipe 39 in this order in a direction from the cooling fluid inflow pipe 39 toward the heat-dissipating fluid outflow pipe 41.

Each of the first overheating prevention valve 45 and second overheating prevention valve 47 is composed of a normally opened two-port solenoid valve and is electrically connected to the controller 14. Each of the first overheating prevention valve 45 and second overheating prevention valve 47 is controlled by the controller 14 such that, when the cooling fluid supply apparatus 1 is not in operation, as illustrated in the drawing, they are in an opened state because of non-energization and open (enable) the first bypass pipe 42 and second bypass pipe 43, respectively, and such that, when the cooling fluid supply apparatus 1 is in proper operation, they are switched to a closed state because of energization and close (disable) the first bypass pipe 42 and second bypass pipe 43, respectively.

In the illustrated example, each of the first overheating prevention valve 45 and second overheating prevention valve 47 is composed of a pilot two-port solenoid valve of the single-acting solenoid spring return type having the checking function. Each of them may also be composed of a two-port valve having no checking function.

The first overheating prevention valve 45 and second overheating prevention valve 47 are configured such that their closing actions and opening actions are slowly performed over time t and time t' (second(s)), respectively, as illustrated in FIG. 4, to suppress water hammer.

The cooling fluid outflow pipe 38 is connected to a third check valve 49 configured to prevent backflow of the fluid flowing toward the temperature adjusting portion 2 in a location near the temperature adjusting portion 2 with respect to the location where the first bypass pipe 42 is connected.

In the drawing, a reference numeral 50 indicates a drain valve connected to the cooling fluid tank 12, and a reference numeral 51 indicates a fluid leakage sensor configured to detect fluid leakage in the housing 10.

To cool the heat load 100 by the cooling fluid supply apparatus 1 having the above-described configuration, the cooling fluid outflow pipe 38 is connected to the heat-load inlet side user pipe 101a connected to an inlet of the heat load 100, the cooling fluid inflow pipe 39 is connected to the heat-load outlet side user pipe 101b connected to an outlet of the heat load 100, and the heat-dissipating fluid inflow pipe 40 is connected to the heat-dissipating fluid sending side user pipe 113a connected to a discharge port of the heat-dissipating pump 112 in the heat-dissipating fluid supply apparatus 110 and is connected to the heat-dissipating fluid return side user pipe 113b connected to a return port of the heat dissipating portion 111 in the heat-dissipating fluid supply apparatus 110.

The cooling fluid tank 12, cooling fluid pump 13, cooling fluid discharge pipe 18, cooling fluid outflow pipe 38, heat-load inlet side user pipe 101a, heat load 100, heat-load outlet side user pipe 101b, cooling fluid inflow pipe 39, cooling fluid return pipe 20, heat exchanger 11, and cooling fluid recovery pipe 19 constitute a cooling fluid circulation path 54 in which the cooling fluid C circulates. The heat-dissipating fluid supply apparatus 110, heat-dissipating fluid sending side user pipe 113a, heat-dissipating fluid inflow pipe 40, heat-dissipating fluid inlet pipe 21, heat exchanger 11, heat-dissipating fluid outlet pipe 22, heat-dissipating fluid outflow pipe 41, and heat-dissipating fluid return side user pipe 113b constitute a heat-dissipating fluid circulation path 55 in which the heat-dissipating fluid R circulates.

Figure 2:
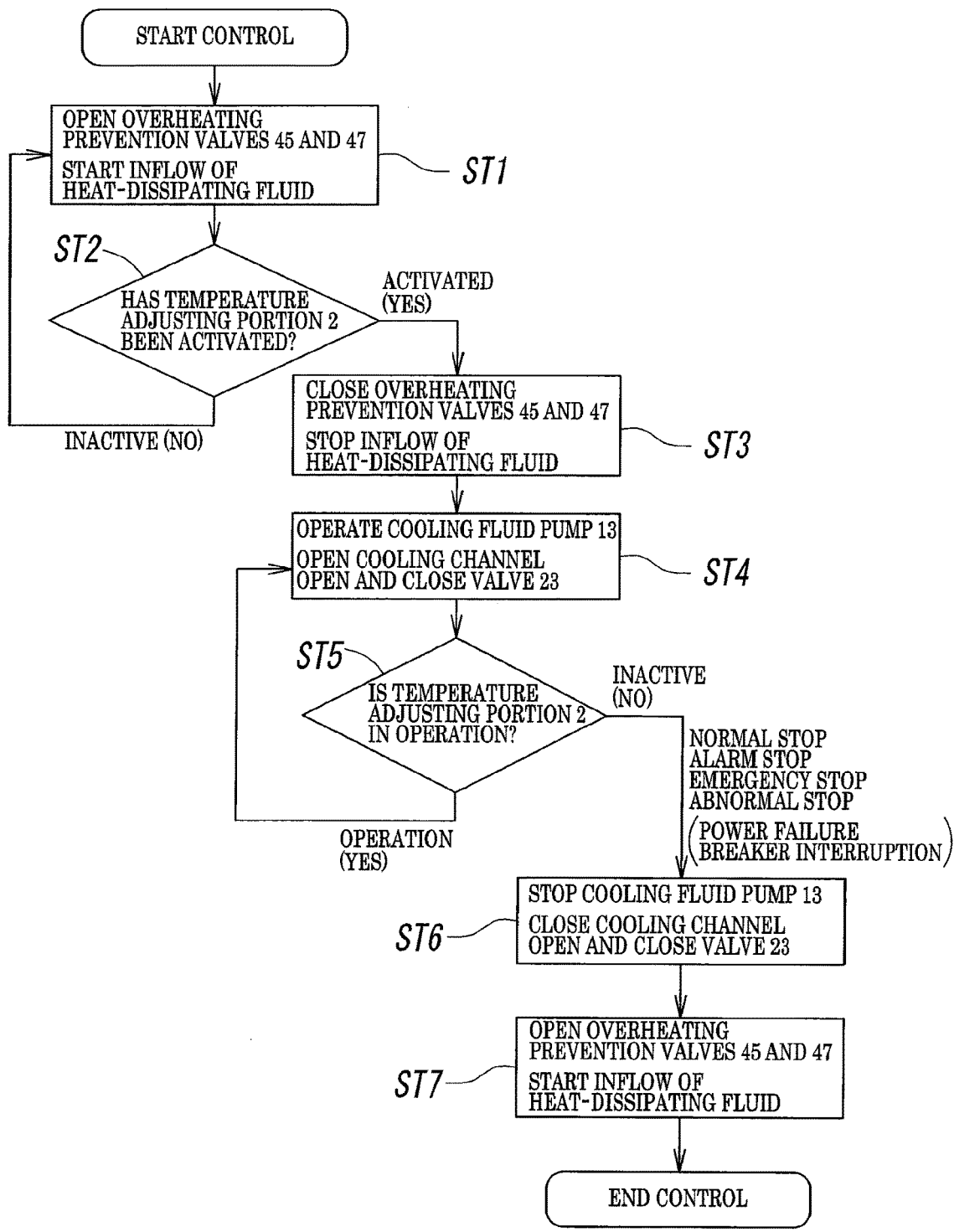
FIG. 2 is a control flowchart for a first cooling method for cooling a heat load by using the cooling fluid supply apparatus.

Next, a method for cooling the heat load 100 by using the cooling fluid supply apparatus 1 is described. FIG. 2 is a control flowchart in a first cooling method.

In the first cooling method, step ST1 indicates a state where a power breaker (not illustrated) for the coolant supply apparatus 1 is turned on and the cooling fluid supply apparatus 1 is energized. At this time, the first overheating prevention valve 45 on the first bypass pipe 42 and the second overheating prevention valve 47 on the second bypass pipe 43 are opened, and the cooling channel open and close valve 23 and heat-dissipating channel open and close valve 25 are closed. Thus, when the heat-dissipating fluid supply apparatus 110 prepared on a user side is in operation, the heat-dissipating fluid flows from the first bypass pipe 42 and second bypass pipe 43 into the cooling fluid circulation path 54 and is supplied to the heat load 100.

Next, at step ST2, it is determined whether the cooling fluid supply apparatus 1, that is, temperature adjusting portion 2 has been activated. When the temperature adjusting portion 2 has not yet been activated, it is determined that the temperature adjusting portion 2 is inactive, the processing returns to step ST1, and control at step ST1 and step ST2 continues. In contrast, when a start button for the temperature adjusting portion 2 is pressed and the temperature adjusting portion 2 is activated, the processing proceeds from step ST3 to step ST4.

At step ST3, the first overheating prevention valve 45 and second overheating prevention valve 47 are switched to a closed state, the first bypass pipe 42 and second bypass pipe 43 are closed, and the supply of the heat-dissipating fluid to the heat load 100 is stopped.

Subsequently, at step ST4, the operation of the cooling fluid pump 13 is started, and the cooling channel open and close valve 23 connected to the cooling fluid recovery pipe 19 is opened. At the same time, the heat-dissipating channel open and close valve 25 connected to the cooling fluid sending pipe is also opened. As a result of this, the cooling fluid circulates in the cooling fluid circulation path 54 and cools the heat load 100 and, simultaneously, the heat-dissipating fluid circulates in the heat-dissipating fluid circulation path 55, the heat-dissipating fluid and cooling fluid exchange heat with each other in the heat exchanger 11, and thus the temperature of the cooling fluid is adjusted.

At this time, the temperature of the cooling fluid flowing out of the heat exchanger 11 toward the cooling fluid tank 12 is detected by the first temperature sensor 24. When that temperature is lower than a set temperature, the circulation of the heat-dissipating fluid is stopped by closing the heat-dissipating channel open and close valve 25, the heat exchange with the cooling fluid is interrupted, and the temperature adjustment for the cooling fluid is interrupted. When the temperature of the cooling fluid is higher than the set temperature, the heat-dissipating channel open and close valve 25 is opened, the supply of the heat-dissipating fluid is started again, thus the heat exchange with the cooling fluid is started again, and the temperature adjustment for the cooling fluid is started again.

Subsequently, at step ST5, it is determined whether the temperature adjusting portion 2 is in proper operation. When it is determined that the temperature adjusting portion 2 is in proper operation, the processing returns to step ST4, and the control at step ST4 and step ST5 continues. When it is determined that the temperature adjusting portion 2 is not in operation (is inactive), the processing proceeds to step ST6 to step ST7.

Examples of the state where the temperature adjusting portion 2 is not in proper operation may include a case where the temperature adjusting portion 2 is normally stopped by a press of a stop button, a case where it is brought to an emergency stop by a press of an emergency stop button, a case where the temperature adjusting portion 2 is brought to an alarm stop by receipt of an anomalous signal from any one of the fluid level sensors 33a, 33b, and 33c, temperature sensors 24 and 29, pressure sensor 30, flow rate sensors 31 and 32, and the like, and a case where the temperature adjusting portion 2 is brought to an abnormal stop by a turning-off of the power breaker, power failure, or the like.

At step ST6, the cooling fluid pump 13 is stopped, the cooling channel open and close valve 23 is closed, and thus the supply of the cooling fluid to the heat load 100 is stopped. At the same time, the heat-dissipating channel open and close valve 25 is closed, and thus the circulation of the heat-dissipating fluid is also stopped.

At step ST7, the first overheating prevention valve 45 on the first bypass pipe 42 and the second overheating prevention valve 47 on the second bypass pipe 43 are opened.

When the temperature adjusting portion 2 is brought to an abnormal stop by a turning-off of the power breaker, power failure, or the like, the cooling fluid supply apparatus 1 is brought into a non-energized state, and the first overheating prevention valve 45 and second overheating prevention valve 47 and the cooling channel open and close valve 23 and heat-dissipating channel open and close valve 25 are brought into a non-energized state. As a result, the first overheating prevention valve 45 and second overheating prevention valve 47 are opened, whereas the cooling channel open and close valve 23 and heat-dissipating channel open and close valve 25 are closed. Because these switching actions are performed substantially simultaneously, step ST6 and step ST7 are performed substantially simultaneously.

By the above-described control, the heat-dissipating fluid sent from the heat-dissipating pump 112 in the heat-dissipating fluid supply apparatus 110 to the heat-dissipating fluid inflow pipe 40 through the heat-dissipating fluid sending side user pipe 113a flows into the cooling fluid outflow pipe 38 through the first bypass pipe 42, is supplied to the heat load 100 through the heat-load inlet side user pipe 101a, and cools the heat load 100. Then, the heat-dissipating fluid cooling the heat load 100 flows from the heat-load outlet side user pipe 101b to the heat-dissipating fluid outflow pipe 41 through the cooling fluid inflow pipe 39 and second bypass pipe 43 and returns to the heat-dissipating fluid supply apparatus 110 through the heat-dissipating fluid return side user pipe 113b. In this way, the heat-dissipating fluid circulates between the heat load 100 and heat-dissipating fluid supply apparatus 110 and cools the heat load 100.

At this time, the heat-dissipating fluid flowing from the heat-dissipating fluid inflow pipe 40 into the first bypass pipe 42 is filtered by passing through the filter 44, and thus impurities are removed. Accordingly, if the heat-dissipating fluid is mixed with a clean cooling fluid, it does not contaminate the cooling fluid. An appropriate filter can be selectively used as the filter 44 according to the type of the heat-dissipating fluid. When the heat-dissipating fluid is the same as the cooling fluid, the filter 44 is optional.

In the way, even when the operation of the temperature adjusting portion 2 is stopped by some malfunction and the supply of the cooling fluid to the heat load 100 is stopped, the cooling fluid supply apparatus 1 enables directly cooling the heat load 100 by using the heat-dissipating fluid, and thus can prevent the overheating of the heat load 100.

Figure 3:
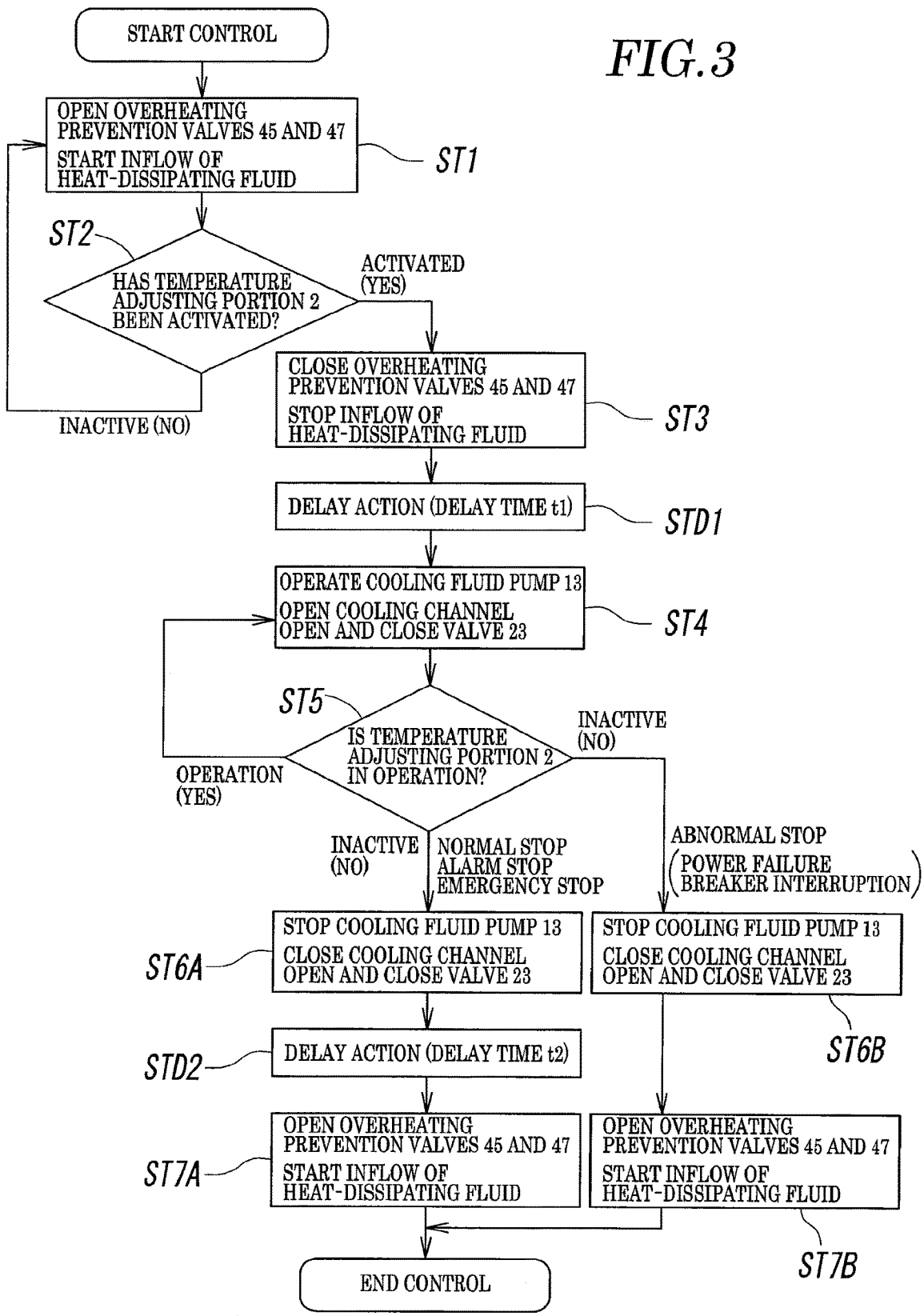
FIG. 3 is a control flowchart for a second cooling method for cooling the heat load by using the cooling fluid supply apparatus.

FIG. 3 is a control flowchart that illustrates a second cooling method for cooling the heat load 100 by the cooling fluid supply apparatus 1. FIG. 4 is a time chart for that control flowchart. The second cooling method differs from the first cooling method in that after the temperature adjusting portion 2 is activated and the overheating prevention valves 45 and 47 on the first and second bypass pipes 42 and 43 start their closing actions, the operation of the cooling fluid pump 13 starts after a fixed delay time t1 and in that after the operation of the temperature adjusting portion 2 stops and the cooling fluid pump 13 stops, a delay time t2 exists or does not exist up to the starting of the action of opening the overheating prevention valves 45 and 47, depending on the cause of the stop of the operation of the temperature adjusting portion 2.

That is, in FIGS. 3 and 4, after the starting of the action of closing the overheating prevention valves 45 and 47 on the first bypass pipe 42 and second bypass pipe 43 at step ST3, the fixed delay time t1 (second(s)) elapses at STD1 to the starting of the operation of the cooling fluid pump 13 and the opening of the cooling channel open and close valve 23 at step ST4. Accordingly, the processing is controlled such that there is an action delay to the action of the cooling fluid pump 13 and cooling channel open and close valve 23.

The reason why the processing waits the delay time t1 is described below. That is, because the overheating prevention valves 45 and 47 are configured such that their closing actions are slowly performed over the time t at the aim of suppressing water hammer, as previously described, the delay time t1 is set such that after the overheating prevention valves 45 and 47 are fully closed, the operation of the cooling fluid pump 13 starts. Consequently, t1 is longer than t.

Subsequently, at step ST5, it is determined whether the temperature adjusting portion 2 is in proper operation. When it is determined that the temperature adjusting portion 2 is inactive, control that varies thereafter depending on the cause of the inactiveness is performed.

That is, when the cause of the inactiveness of the temperature adjusting portion 2 is a normal stop caused by a press of a stop button, an emergency stop caused by a press of an emergency stop button, a stop caused by an alarm upon receipt of an anomalous signal from any one of the fluid level sensors 33a, 33b, and 33c, temperature sensors, pressure sensor 30, flow rate sensors, and the like, that is, a stop in an energized state, the processing proceeds from step ST5 to step ST6A. At step ST6A, the processing is controlled such that the cooling fluid pump 13 is stopped, the cooling channel open and close valve 23 is closed, the fixed delay time (second(s)) elapses at step STD2, after this elapse of the delay time t2, the processing proceeds to step ST7A, and the first overheating prevention valve 45 on the first bypass pipe 42 and the second overheating prevention valve 47 on the second bypass pipe 43 start their opening actions.

The reason why the fixed delay time t2 elapses at step STD2 is that after the cooling fluid pump 13 stops, the supply of the heat-dissipating fluid into the cooling fluid circulation path 54 waits until the pressure difference between the pressure of the cooling fluid in the cooling fluid circulation path 54 and the pressure of the heat-dissipating fluid in the heat-dissipating fluid circulation path 55 disappears.

When the cause of the inactiveness of the temperature adjusting portion 2 is an abnormal stop caused by the interruption of the power breaker, power failure, or the like, that is, a stop caused by being brought into a non-energized state, the processing proceeds from step ST5 to step ST6B to step ST7B. At step ST6B, the cooling fluid pump 13 is stopped, and the cooling channel open and close valve 23 is closed. At step ST7B, the first overheating prevention valve 45 on the first bypass pipe 42 and the second overheating prevention valve 47 on the second bypass pipe 43 are switched to an opened state. The control at step ST6B and the control at ST7B are performed substantially simultaneously.

The contents of the control at step ST1 and the control at step ST2 in the second cooling method are substantially the same as the contents of the control at step ST1 and the control at step ST2 in the first cooling method.

In FIG. 1, the cooling channel open and close valve 23 is connected to the cooling fluid recovery pipe 19, and the heat-dissipating channel open and close valve 25 is connected to the heat-dissipating fluid outlet pipe 22. The location where the cooling channel open and close valve 23 is connected may be any location where it can open and close the channel for the cooling fluid other than the locations of the cooling fluid outflow pipe 38 and cooling fluid inflow pipe 39 in the user-pipe connecting portion 3. The location where the heat-dissipating channel open and close valve 25 is connected may also be any location where it can open and close the channel for the heat-dissipating fluid other than the locations of the heat-dissipating fluid inflow pipe 40 and heat-dissipating fluid outflow pipe 41 in the user-pipe connecting portion 3.

In the above-described embodiment, the cooling fluid tank 12 is disposed in the temperature adjusting portion 2. The cooling fluid tank 12 functions as a buffer for accommodating changes in the amount of the cooling fluid C and also functions to receive a fluid leak from the cooling fluid pump 13. Accordingly, the cooling fluid tank 12 is optional and can be omitted. When the cooling fluid tank 12 is omitted, a structure suited for the case where no tank is disposed is used in the cooling fluid pump 13, and the cooling fluid pump 13 is directly connected to the cooling fluid recovery pipe 19. The heater 34, fluid level sensors, or temperature fuse, or the like can also be omitted.

In the above-described embodiments, each of the overheating prevention valves 45 and 47 connected to the first bypass pipe 42 and second bypass pipe 43 is composed of a solenoid valve. Each of the overheating prevention valves may be composed of a two-port valve of the type mechanically opened or closed by a manual operation, thus allowing the first bypass pipe 42 and second bypass pipe 43 to be opened and closed manually when the temperature adjusting portion 2 is stopped by some malfunction.

REFERENCE SIGNS LIST

1 cooling fluid supply apparatus
2 temperature adjusting portion 3 user-pipe connecting portion
10 housing
11 heat exchanger
13 cooling fluid pump
23 cooling channel open and close valve
25 heat-dissipating channel open and close valve
38 cooling fluid outflow pipe
39 cooling fluid inflow pipe
40 heat-dissipating fluid inflow pipe
41 heat-dissipating fluid outflow pipe
42 first bypass pipe
43 second bypass pipe
44 filter
45 first overheating prevention valve
46 first check valve
47 second overheating prevention valve
48 second check valve
49 third check valve
54 cooling fluid circulation path
55 heat-dissipating fluid circulation path
100 heat load
101a heat-load inlet side user pipe
101b heat-load outlet side user pipe
110 heat-dissipating fluid supply apparatus
113a heat-dissipating fluid sending side user pipe
113b heat-dissipating fluid return side user pipe
C cooling fluid
R heat-dissipating fluid
t1, t2 delay time

The invention claimed is:

1. A cooling fluid supply apparatus with a safety mechanism, the cooling fluid supply apparatus comprising:
a temperature adjusting portion configured to cause a cooling fluid and a heat-dissipating fluid to exchange heat with each other and adjust a temperature of the cooling fluid; and a user-pipe connecting portion for connecting the temperature adjusting portion to a heat load and a heat-dissipating fluid supply apparatus with user pipes disposed therebetween,
wherein the user-pipe connecting portion includes a cooling fluid outflow pipe allowing the cooling fluid to flow from the temperature adjusting portion toward the heat load therethrough, a cooling fluid inflow pipe allowing the cooling fluid to flow from the heat load toward the temperature adjusting portion therethrough, a heat-dissipating fluid inflow pipe allowing the heat-dissipating fluid to flow from the heat-dissipating fluid supply apparatus toward the temperature adjusting portion therethrough, and a heat-dissipating fluid outflow pipe allowing the heat-dissipating fluid to flow from the temperature adjusting portion toward the heat-dissipating fluid supply apparatus therethrough, the user-pipe connecting portion further includes a first bypass pipe connecting the cooling fluid outflow pipe and the heat-dissipating fluid inflow pipe and a second bypass pipe connecting the cooling fluid inflow pipe and the heat-dissipating fluid outflow pipe,
the first bypass pipe is connected to a first overheating prevention valve for opening and closing the first bypass pipe and to a first check valve for blocking a stream of the fluid from the cooling fluid outflow pipe toward the heat-dissipating fluid inflow pipe, and
the second bypass pipe is connected to a second overheating prevention valve for opening and closing the second bypass pipe and to a second check valve for blocking a stream of the fluid from the heat-dissipating fluid outflow pipe toward the cooling fluid inflow pipe.

2. The cooling fluid supply apparatus according to claim 1, wherein the first overheating prevention valve and the second overheating prevention valve are operated such that they close the first bypass pipe and the second bypass pipe, respectively, when the temperature adjusting portion is in operation and such that they open the first bypass pipe and the second bypass pipe, respectively, when the temperature adjusting portion is not in operation.

3. The cooling fluid supply apparatus according to claim 1, wherein the cooling fluid outflow pipe is connected to a third check valve for preventing backflow of the fluid flowing toward the temperature adjusting portion in a location near the temperature adjusting portion with respect to a location where the first bypass pipe is connected.

4. The cooling fluid supply apparatus according to claim 1, wherein a filter for filtering the heat-dissipating fluid is connected to the first bypass pipe between the heat-dissipating fluid inflow pipe and the first overheating prevention valve.

5. The cooling fluid supply apparatus according to claim 1, wherein the temperature adjusting portion includes a heat exchanger configured to cause the cooling fluid and the heat-dissipating fluid to exchange heat with each other, a cooling fluid pump configured to send the cooling fluid having an adjusted temperature to the heat load through the cooling fluid outflow pipe, and a cooling channel open and close valve configured to open and close a channel for the cooling fluid, and the cooling channel open and close valve opens the channel for the cooling fluid when the temperature adjusting portion is in operation and closes the channel for the cooling fluid when the temperature adjusting portion is not in operation.

6. The cooling fluid supply apparatus according to claim 5, wherein the temperature adjusting portion includes a housing, the heat exchanger, the cooling fluid pump, and the cooling channel open and close valve are disposed inside the housing, and the user-pipe connecting portion is arranged outside the housing.

7. A method for cooling a heat load by supplying a cooling fluid to the heat load by using a cooling fluid pump in a cooling fluid supply apparatus, the cooling fluid having a temperature adjusted by causing the cooling fluid circulating in a cooling fluid circulation path connecting the cooling fluid supply apparatus and the heat load and a heat-dissipating fluid circulating in a heat-dissipating fluid circulation path connecting the cooling fluid supply apparatus and a heat-dissipating fluid supply apparatus to exchange heat with each other, wherein
the cooling fluid circulation path and the heat-dissipating fluid circulation path are connected with bypass pipes openable and closable by overheating prevention valves disposed therebetween,
when the cooling fluid is supplied to the heat load by operation of the cooling fluid supply apparatus, the cooling fluid circulation path and the heat-dissipating fluid circulation path are disconnected from each other by closing the bypass pipes by using the overheating prevention valves, and
when the supply of the cooling fluid to the heat load is stopped by a stop of the operation of the cooling fluid supply apparatus, the heat-dissipating fluid from the heat-dissipating fluid supply apparatus is supplied to the heat load by connecting the cooling fluid circulation path and the heat-dissipating fluid circulation path to each other by opening the bypass pipes by using the overheating prevention valves.

8. The method for cooling the heat load according to claim 7, wherein when the cooling fluid supply apparatus is activated, the cooling fluid pump is operated after a delay time after an action of closing the overheating prevention valves starts, and when operation of the cooling fluid supply apparatus is stopped in an energized state, the overheating prevention valves are opened after a delay time after the cooling fluid pump is stopped.

* * * * *